United States Patent [19]

Hastings et al.

[11] Patent Number: 5,966,289

[45] Date of Patent: Oct. 12, 1999

[54] ELECTRONIC DEVICE SECUREMENT SYSTEM

[75] Inventors: Robert J. Hastings, Kingwood; Daniel T. Thompson, Houston, both of Tex.

[73] Assignee: Compaq Computer Corporation, Houston, Tex.

[21] Appl. No.: 09/144,249

[22] Filed: Aug. 31, 1998

[51] Int. Cl.[6] .................................................. H05K 7/20
[52] U.S. Cl. .......................... 361/704; 361/690; 361/707; 361/709; 361/710; 361/719; 361/718; 361/720; 361/721; 257/718; 257/719; 439/362; 165/80.3; 165/185
[58] Field of Search .................................... 361/688, 690, 361/704, 707, 718–721, 740, 747; 257/721, 722, 727; 439/362; 165/80.3, 185

[56] References Cited

U.S. PATENT DOCUMENTS

| | | | |
|---|---|---|---|
| 4,935,947 | 6/1990 | Welsh ....................................... | 361/801 |
| 5,032,952 | 7/1991 | Cooke et al. ........................... | 361/747 |
| 5,363,552 | 11/1994 | Coniff ..................................... | 361/719 |
| 5,426,567 | 6/1998 | Opeka ..................................... | 361/740 |
| 5,650,917 | 7/1997 | Hsu ......................................... | 361/759 |
| 5,815,371 | 9/1998 | Jeffries et al. .......................... | 361/704 |
| 5,822,197 | 10/1998 | Thuault .................................... | 361/740 |

*Primary Examiner*—Leo P. Picard
*Assistant Examiner*—Boris L. Chervinsky

[57] ABSTRACT

A system for securing an electronic component, such as a CPU, includes a support extending substantially in a plane and a fastener coupled to the support. The support may be a heat sink secured to a component for dissipating heat generated during operation of the component. The fastener extends through extensions or fins of the heat sink, generally parallel to the plane of the heat sink and component package. A biasing spring urges the fastener toward a disengaged position. A biased retainer maintains the biasing spring and fastener within the assembly. The component is initially engaged in a receiving socket for installation. The fastener is then engaged in the mechanical support to draw the component into full engagement. A reference surface on the securement assembly contacts the mechanical support to limit engagement of the component. The fastener may include a torque-limiting assembly for limiting the torque applied to the mechanical support upon full engagement of the component.

30 Claims, 7 Drawing Sheets

ELECTRONIC DEVICE SECUREMENT SYSTEM

BACKGROUND OF THE INVENTION

1. Field of the Invention

The present invention relates generally to the field of computer and similar electronic systems in which one or more component packages is installed in a socket-type connector for exchanging data with external circuitry. More particularly, the invention relates to a technique for securing a component package, such as a CPU, in a computer system to provide a reliable, robust and high tolerance interface between the component and the supporting system.

2. Description of the Related Art

In computer and other electronic systems, it is often necessary to assemble component modules at a system level to provide desired functionality. For example, in personal computers, servers, work stations and the like, central processing units, expansion cards, and other component circuits are often assembled with supporting circuits to define an overall system. Various types of supporting circuits may be envisaged for interfacing the components. In a typical computer system, certain of such component circuits are received and supported by a motherboard or system board. The system board serves as the base for the components, and routes both power and data between the component circuits and external circuitry.

In one design for assembled computer components, a socket is provided directly on the supporting board to receive and to interface with the component circuitry. The socket includes internal connections extending between internal contacts and the supporting board. The component is inserted into the socket during assembly of the system, and has contact pads or pins which make electrical contact with the socket contacts. The socket serves both as a mechanical support for the component as well as an electrical interface between the supporting board and the component.

While such conventional component support and interface schemes have proven generally adequate for many applications, they are not well suited to increasingly complex and densely packed circuit components. For example, due to the large number of input and output connections in certain complex circuit components, such as CPU's, a corresponding number of conductive paths must be provided in interface hardware receiving the components. To minimize the size of the components and the overall system, however, it is often desirable to confine the interface connections to a relatively small area. In certain known system, for example, densely packed contact pads are formed along an edge of a component circuit board. The circuit board is disposed in a protective package, and the package is intended to be coupled over a support socket, completing connection of the contact pads with respective internal conductors within the socket during installation.

As the density and number of connections in such systems increases, however, so does the tolerance required for the interface components. Misalignment or incomplete engagement of the circuit components can render the systems non-functional both from the time of their initial installation and during subsequent use. Moreover, tolerances provided in conventional socket-mounting structures that facilitate insertion of components by hand may be simply unacceptable for more demanding applications wherein connections are more numerous or densely packed.

There is a need, therefore, for an improved technique for securing circuit components in systems such as computer systems. There is a particular need for a securement system capable of providing positive engagement between a component and supporting interface hardware, and which offers proper control of alignment both during initial installation and throughout the subsequent life of the system.

SUMMARY OF THE INVENTION

The present invention provides an electronic component securement system designed to respond to these needs. The system may be employed with a variety of component circuits, but is particularly well suited for securement of high density circuits, such as CPU's, in computer systems. The system facilitates both mechanical and electrical connection the component on its support, affording proper alignment of the component with interface connections, and reference surfaces for ensuring full engagement while limiting movement to avoid damage to either the component or the support. In a favored approach, a fastener draws the component into engagement in a receiving socket, reducing the risk of damage that can result from hand installation. The fastener may be designed to be manipulated by hand, eliminating the need for special tooling for installation and removal of the component. Moreover, the system may provide for torque limiting, further reducing the potential for damage to the electrical or mechanical supports, and providing tactile feedback indicative of complete engagement of the component. Also, in a particularly favored approach, the securement system may be designed around a heat sink which dissipates thermal energy generated during operation of the component. The heat sink then serves the additional functions of supporting the securement system subcomponents and ensuring proper alignment and engagement of the electronic component in its interface.

Thus, in accordance with one aspect of the invention, an assembly is provided for securing an electronic component to a mating support. The support includes a socket configured to receive a portion of the component. The assembly includes a base, a heat sink, and a fastener. The base is disposed adjacent to the socket and includes an aperture for receiving the fastener. The heat sink has a substantially planar securement surface configured to be secured to the component. The fastener extends through a portion of the heat sink in a direction generally parallel to the plane of the securement surface. The fastener is receivable in the aperture for securing the component in engagement with the socket. A biasing member may be provided between the fastener and the heat sink for urging the fastener towards a disengaged position away from the base. In a preferred configuration, a retaining member is provided for holding the fastener and biasing member in the assembly. The heat sink may include a reference surface which contacts a portion of the support upon full engagement of the component.

In accordance with another aspect of the invention, an electronic component module is provided for assembly with a component interface. The component module includes an electronic component package extending substantially in the plane. The component package, in turn, includes an electronic component configured to be connected to external circuitry via a component interface. A securement assembly extends from the component package. The securement assembly includes a support and a fastener retained by the support. The fastener extends substantially parallel to the plane of the component package. The fastener is configured to be received in the component interface to draw the component into an installed position in the component interface. In one preferred arrangement, fasteners used in the securement technique may be adapted for limiting torque applied to the component support upon full engagement. The fastener may also be configured to be hand tightened and loosened, thereby reducing the need for special tooling for installation and removal of the component.

The invention also provides a computer system including a supporting board, an electronic component, and a securement assembly. The supporting board includes an electrical socket and a mechanical support adjacent to the socket. The electronic component has an edge engageable in the socket for completing connection of the component to the supporting board. The securement assembly is coupled to the component and includes a heat dissipating member and a fastener. The fastener is coupled to the heat dissipating member and is engageable in the mechanical support to advance and retain the edge of the component in the socket.

In accordance with another aspect of the invention, a method is provided for securing an electronic component to an interface. The electronic component extends substantially in the plane and is configured to be mounted substantially transverse to the interface. In accordance with the method, a securement assembly is coupled to the component. The securement assembly includes a support coupled to the component, and a fastener coupled to the support. The fastener extends substantially parallel to the plane. The component is then initially engaged with the interface to align the component in the interface. The fastener is engaged with the interface to draw the component into final engagement with the interface. The support may be a heat dissipating member including a plurality of fins, with the fastener extending through at least one of the fins. By engaging the fastener in the interface, the component is thus fully engaged with the support, providing appropriate alignment and engagement, even for densely packed electronic components, such as CPUs.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
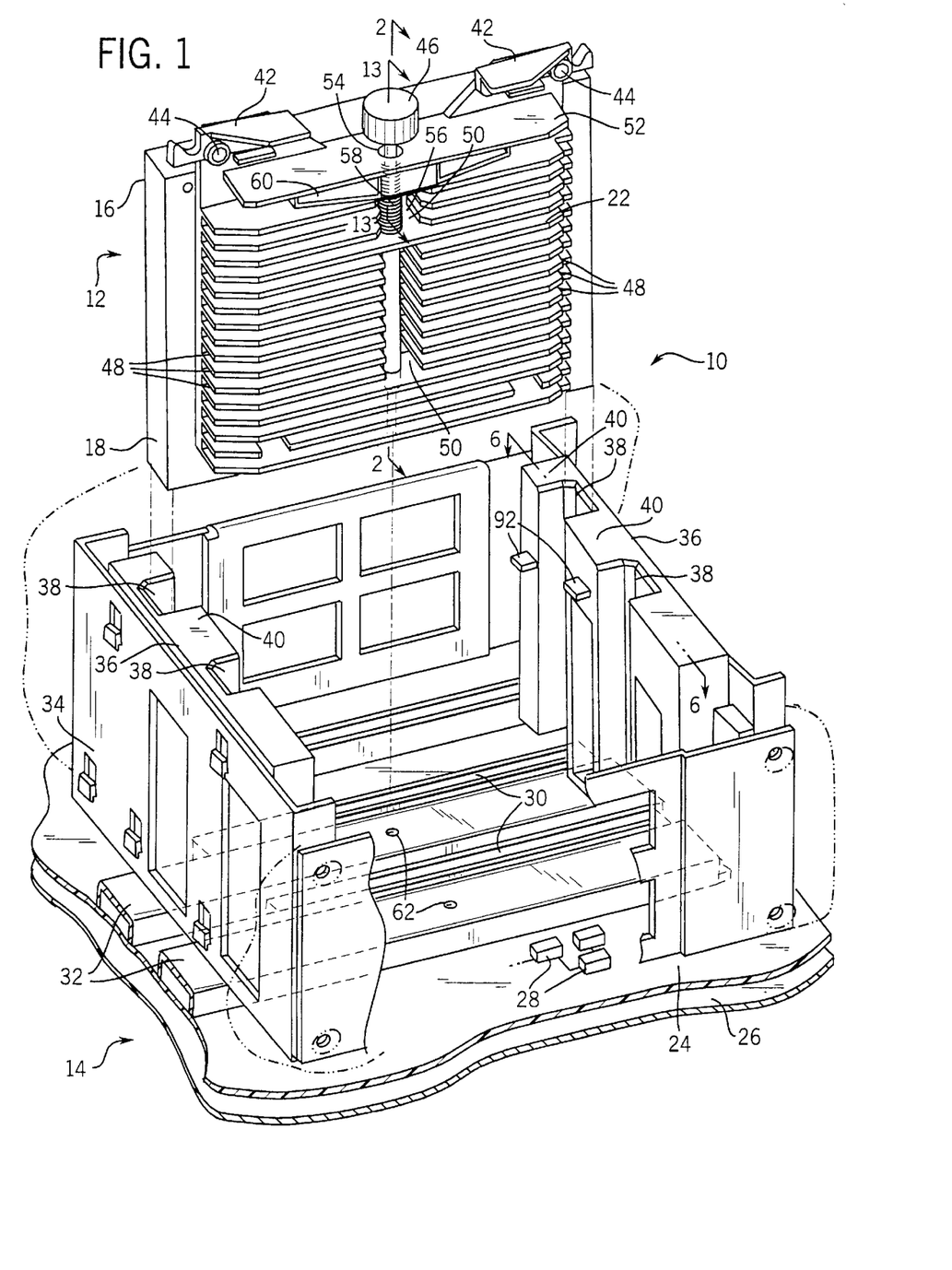
FIG. 1 is a perspective view of a portion of a computer system and a component package configured to be secured in the system in accordance with certain aspects of the present technique.

Turning now to the drawings, and referring first to FIG. 1, a securement system, designated generally by the referenced numeral 10, is illustrated for coupling a component 12 in a computer system 14. In the particular embodiment illustrated, component package 12 includes a pre-packaged processor assembly 16, in which a CPU is secured for mounting to a system board in a personal computer system or server. It should be understood, however, that the present technique may be applied in various types of systems and for various types of component packages, including CPU's, riser cards, expansion cards, memory devices, and so forth.

In the embodiment shown in the Figures, processor assembly 16 includes a housing 18 in which a component card or circuit board 20 (see, e.g., FIG. 4) is secured. As best illustrated in FIG. 1, housing 18 forms a generally box-like enclosure which protects the internal components from damage during shipping and installation. A securement mounting base is fixed to housing 18 and facilitates complete engagement and securement of the housing and component in the computer system. In the preferred embodiment illustrated in the drawings, a heat sink 22 serves this purpose. In the particular component package shown, heat sink 22 is secured to a face of housing 18 through which heat is dissipated during operation of the component. Where such heat dissipation is performed in other ways or is unnecessary in a particular application, however, an alternatively configured mounting support may be employed. As described more fully below, heat sink 22 serves both to dissipate heat from component package 12 and to support various subcomponents of the securement system. Also, heat sink 22 provides a base or reference surface for ensuring complete engagement of the component within the computer system and for limiting such engagement during assembly.

In the illustrated embodiment, computer system 14 includes a system board 24 mounted on a support plate 26. System board 24, which may support one or several component packages 12, may also support additional add-on circuit boards, such as expansion cards, memory circuitry, and the like. In the illustrated embodiment, system board 24 supports various surface-mounted components or circuitry, represented generally at reference numeral 28, interconnected to perform desired functions, such as execution of an application software, network communications, and so forth. System board 24 provides interface connections for component package 12 via one or more surface-mounted sockets 30. Sockets 30 may be of any suitable design, such as conventional multi-conductor, slotted supports for receiving an edge of a circuit card or PC board. Parallel to sockets 30, mechanical supports 32 are disposed on board 24. As described more fully below, mechanical supports 32 provide for both positive securement of component package 12 to board 24, as well as referencing of alignment and engagement of the package upon installation.

In a fully assembled system, system board 24 would be mounted in a chassis (not shown) along with various other components, such as disk drives, power supplies, cooling fan assemblies, and so forth. Within the chassis, a support frame 34 is provided for receiving component package 12 and for aligning the package over respective sockets 30 and mechanical supports 32. In the embodiment illustrated in FIG. 1, support frames 34 comprises a metallic stamped and bent framework in which a pair of guide members 36 are secured in mutually facing relation. Guide members 36 form slots 38 for receiving each component package to be secured to board 24. Slots 38 are separated from one another by partitions 40 which serve to receive a portion of the component package, extensions of housing 18 in the illustrated embodiment, and guide the package into place during installation.

Several features may be provided on component package 12 for initial and final securement of the package in the computer system. In the illustrated embodiment, a pair of ejectors 42 are disposed adjacent to an upper end of heat sink 22. Each ejector 42 is pivotable on a rivet 44 and engages an inner surface of guide members 36 for initial securement of the package in support frame 34, as discussed in greater detail below. For final securement of the package in the system, and for ensuring a complete insertion into sockets 30, a fastener 46 extends through heat sink 22. To accommodate fastener 46 and associated structures described below, fins 48 of the heat sink form recesses 50 through which the fastener passes. Certain of the recesses formed in fins 48 also facilitate insertion of additional fasteners for attaching heat sink 22 to housing 18, as discussed below with particular reference to FIG. 7. An upper fin 52 serves as a support for a biasing and retaining structure for maintaining a fastener 46 in place and for urging the fastener to a biased position. Accordingly, upper fin 52 includes an aperture 54 for permitting passage of the fastener therethrough. Additional fins below upper fin 52 form a recess 56 for accommodating the retaining and biasing components, including a spring 58 and a retainer 60. In the illustrated embodiment, fastener 46 is a threaded bolt which engages and is secured within a corresponding threaded aperture 62 provided in mechanical support 32 on board 24. Alternatively, a threaded aperture 62 may include apertures formed within supports 32, and captive nuts provided in or below the apertures.

Figure 2:
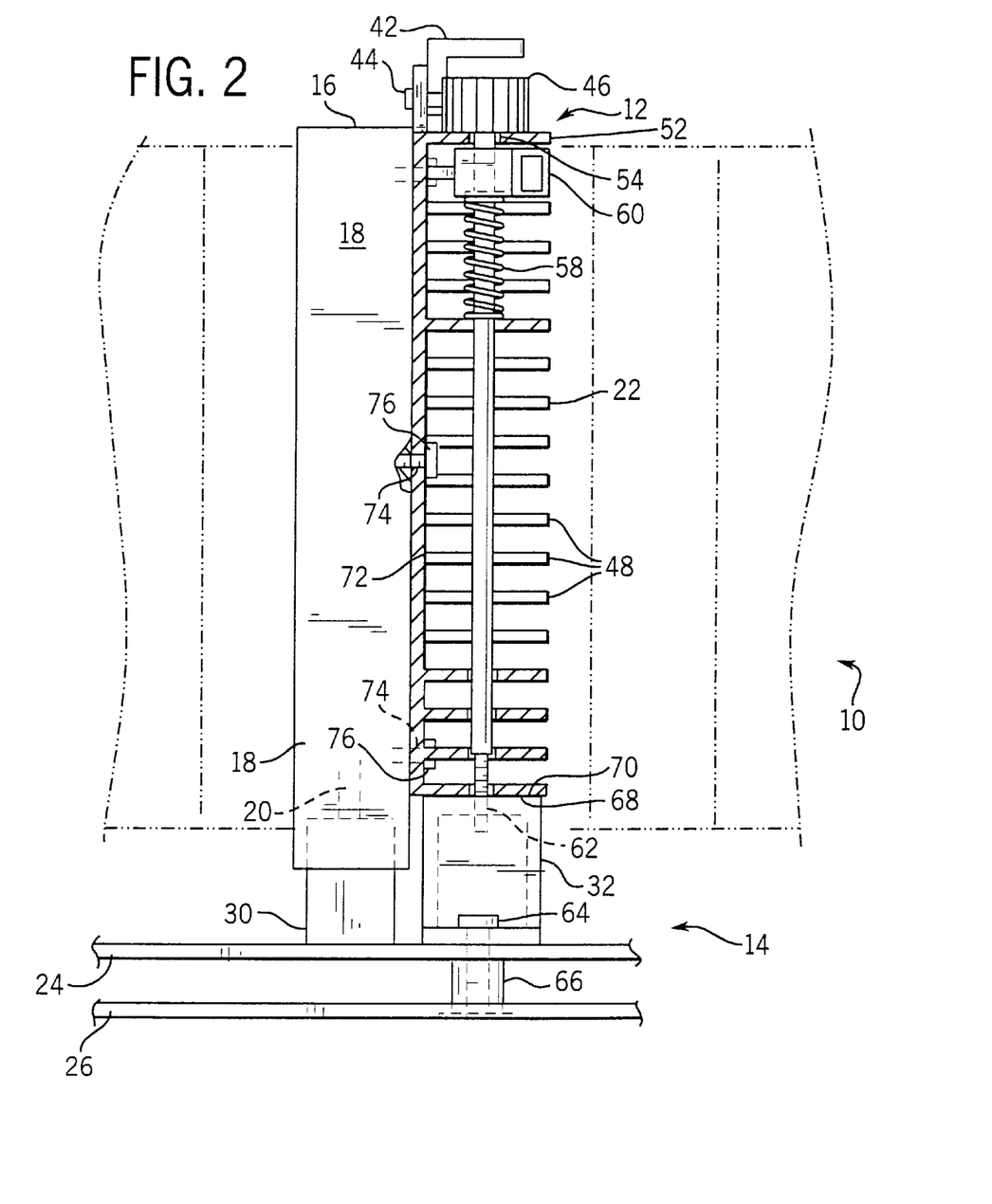
FIG. 2 is a side elevational view in partial section along line 2—2 of FIG. 1, illustrating the component package secured to the computer system to complete connections between a component and an interface support.

FIG. 2 is a side elevational view of the component package following insertion and securement into the support frame, sockets and mechanical supports shown in FIG. 1. As illustrated in FIG. 2, mechanical supports 32 are generally channel-shaped support structures, made of a heavy-gage metal plate. Each support 32 is secured to board 24 via fasteners 64 which extend through a portion thereof, and which may interface with standoffs 66 provided between board 24 and support plate 26. Each socket 30 extends parallel to a mechanical support 32 and is spaced from the mechanical support so as to align with component 20 within the component package following insertion of the package in the support frame (see, e.g., FIG. 4). Moreover, each mechanical support 32 has an upper reference surface 68 designed to contact a corresponding lower reference surface 70 of heat sink 22 to limit engagement of the component package upon full insertion in the system. As will be appreciated by those skilled in the art, surfaces 68 and 70 also provide for control of parallelism and perpendicularity between the component housed within package 12, and socket 30. In the illustrated embodiment, heat sink 22 includes a rear panel 72 which fits flush against a face of housing 18 for transmitting thermal energy from the housing during operation. A series of apertures 74 are formed in rear panel 72 to receive fasteners 76 for attaching the heat sink to the housing. Thus, as an assembled package, heat sink 22 serves to carry securement components, transfer heat from the package, and to provide for alignment and engagement depth control of the component upon securement in the system.

Figure 3:
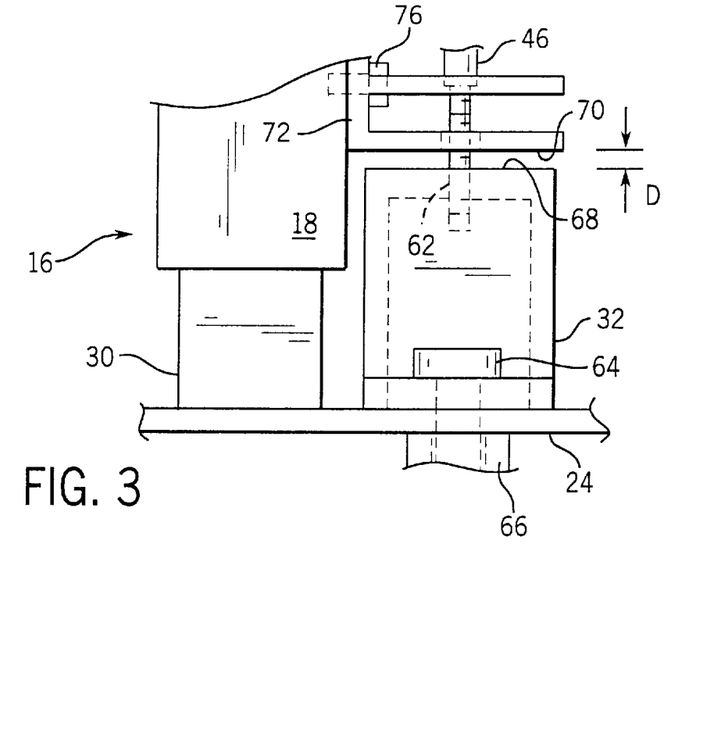
FIG. 3 is a detail view of a portion of the component package and computer system shown in FIG. 2 prior to complete securement of the package in the system.
Figure 4:
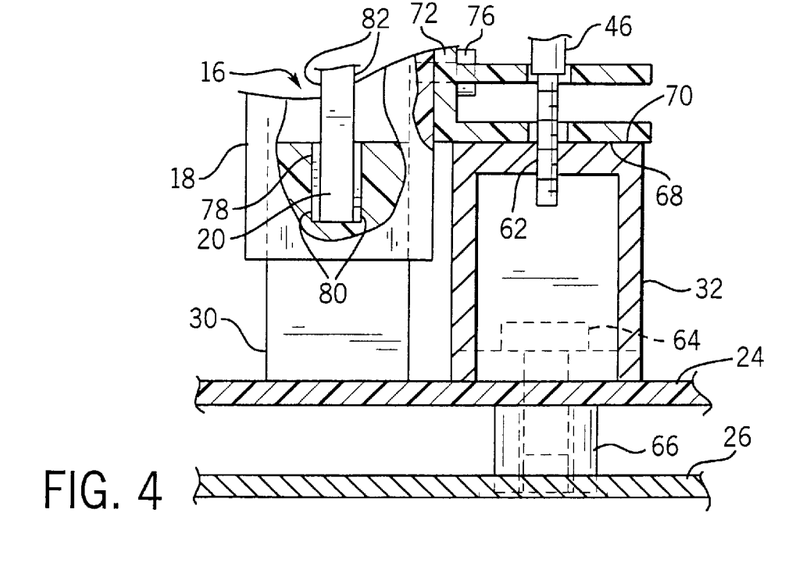
FIG. 4 is a detail view of the component package shown in FIG. 3 following complete engagement of the securement system.

FIGS. 3 and 4 show in somewhat greater detail the progressive engagement of package 12 in the system as described above. As illustrated in FIG. 3, following initial engagement of ejectors 42 (see FIGS. 1 and 2), housing 16 is properly aligned over socket 30, but is not fully engaged therein. It has been found that while such ejector systems may be sufficient for attachment of certain devices in computer systems, they may sometimes permit misalignment or less than full engagement of high-tolerance components, particularly those including a large quantity of closely-spaced contact pads. Accordingly, in the embodiment illustrated in FIG. 3, following engagement of the ejectors provided on the component package, a distance designated by the letter D in FIG. 3, of approximately 0.020 inches, remains between reference surfaces 68 and 70. Following such initial engagement, fastener 46 is engaged threadingly into aperture 62, to draw the package into full engagement on the support, as shown in FIG. 4. Upon such full engagement, reference surfaces 68 and 70 come into contact with one another, limiting further engagement of component 20 in socket 30. As shown in FIG. 4, in the present embodiment, a slotted recess 78 is formed in socket 30, and includes a plurality of internal electrical contacts 80 which contact corresponding conductive pads (not shown) on both front and rear sides 82 of component 20. As will be appreciated by those skilled in the art, electrical contacts 80 will be routed from the interior of socket 30 to external circuitry on system board 24 and from board 24, to additional circuitry included in the computer system.

Figure 5:
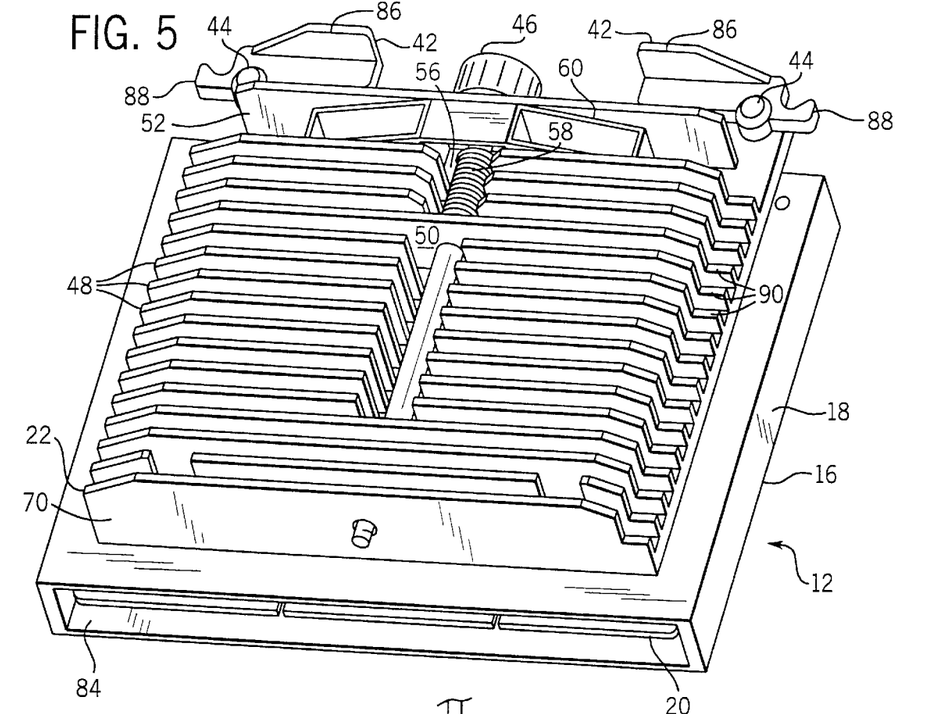
FIG. 5 is a bottom perspective view of the component package illustrating a presently preferred configuration for the various elements of the securement system.
Figure 6:
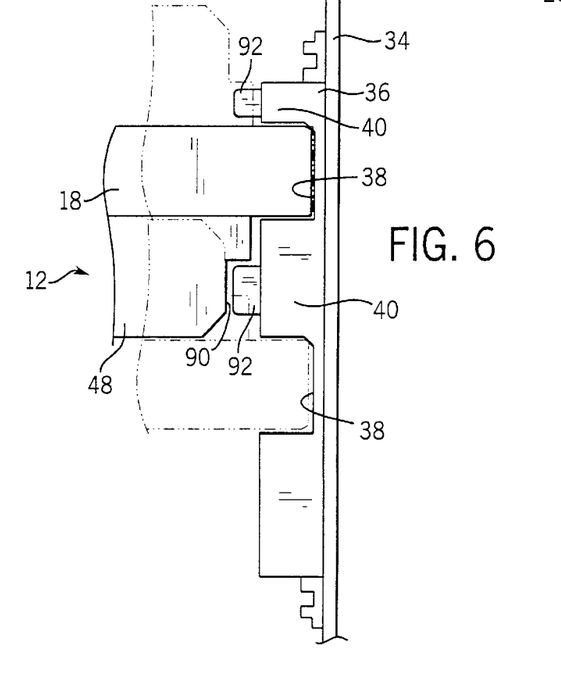
FIG. 6 is a top detail view of the package of FIG. 5 during insertion into a support frame of the type shown in FIG. 1.

The fully-assembled component package 12 is illustrated in bottom perspective view in FIG. 5. As shown in FIG. 5, housing 18 forms a shell having a lower or bottom opening 84, providing access to an edge of component 20 housed therein. Thus, upon engagement of the package within the computer system, socket 30 is free to engage housing 18 through lower opening 84 to come into contact with the lower edge of component 20. Also as shown in FIG. 5, package 12 includes features which facilitate proper insertion of the package within the securement structure described above, particularly within support frame 34 of FIG. 1. In particular, ejectors 42 include tabs 86 which can be grasped by a user to force pivotal movement of the ejectors about rivets 44. A hook-like engagement extension 88 is provided on each ejector for engaging a corresponding recess (not shown) in guide members 36 (see, e.g., FIG. 1) for initial engagement of the package in the securement system as described above. Moreover, to ensure proper alignment of package 12 in the system, recesses 90 are formed along one side of fins 50. As shown in FIG. 6, stops or abutment members 92 extend from each partition 40 of at least one of the guide members 36, and permit sliding engagement of the package when properly aligned with recesses 90 of the fins. If the package is improperly aligned in the system, stops 92 engage a side of the fins opposite from recesses 90 to prevent insertion of the package in the system.

The securement system described above may be conveniently provided as a subassembly of the support and attachment structures, configured for mounting to a component housing to form the completed component package 12. The various subcomponents of the system facilitating this subassembly approach are illustrated in an exploded perspective view of FIG. 7. As described above, the system includes a mechanical support, such as in the form of heat sink 22. Fins 48 of the heat sink permit dissipation of heat from the component housing, and also serve as support structures for the securement system. In particular, heat sink 22 is designed to receive fastener 46, and retainer 60 which holds fastener 46 in the desired position within the heat sink. Biasing spring 58 urges fastener 46 toward a disengaged (i.e., upward) position by engagement with one of the fins, and is stopped in its upward position by retainer 60. A series of fasteners 76 extend through the heat sink and aid in forming a unitary package with enclosure 18.

Figure 7:
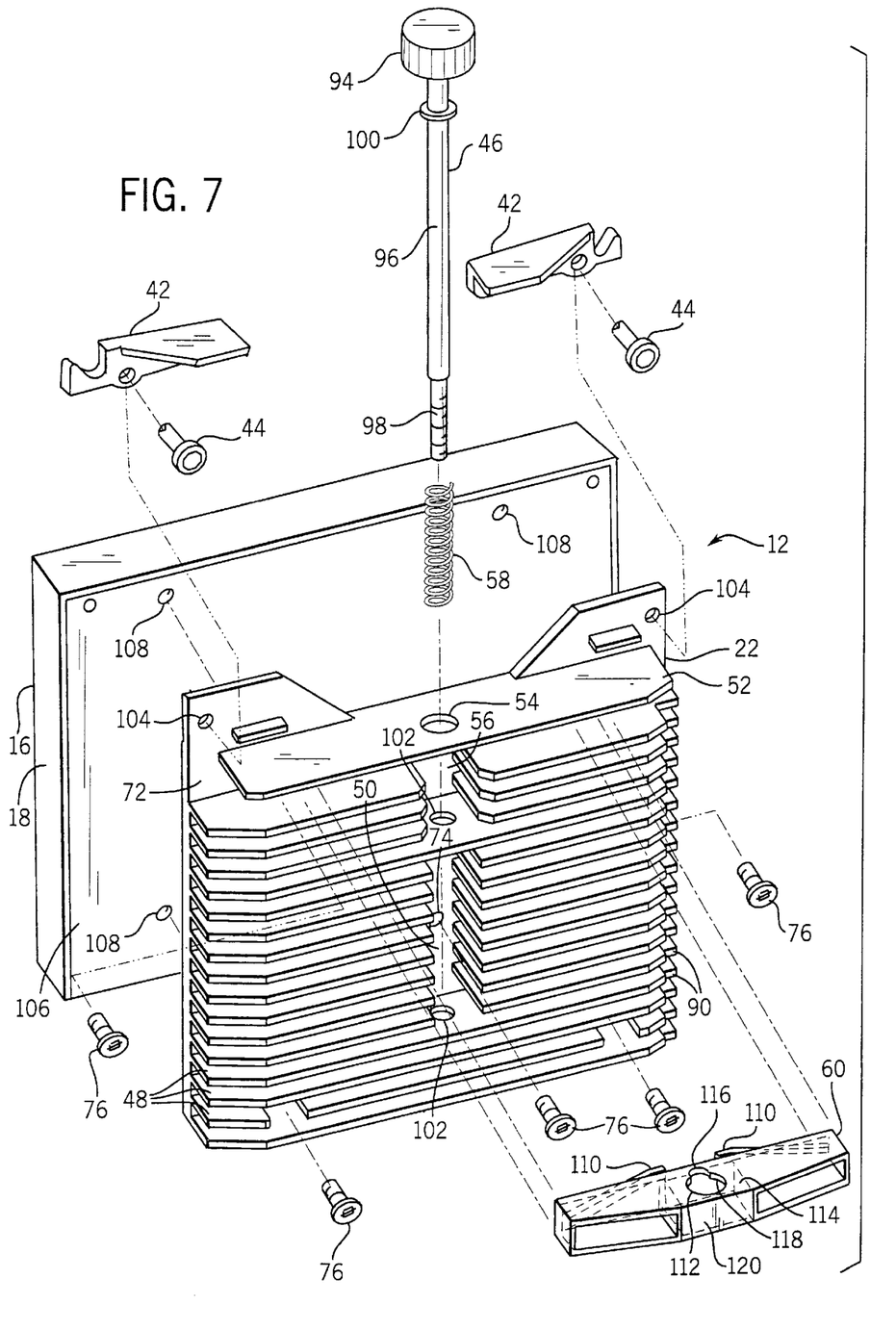
FIG. 7 is an exploded view of the component package illustrating assembly of the various elements shown in FIG. 5.

The preferred configurations of fastener 46 and retainer 60 facilitate both manufacturing, assembly, and servicing of the securement system. In particular, as shown in FIG. 7, fastener 46 includes a head 94 which may be grasped by hand for tightening of the fastener in the mechanical support as described above. Alternatively, head 94 may be designed to receive a fastening tool, such as a screw driver. Moreover, while conventional threaded fasteners may be provided for this purpose, in a particularly preferred embodiment, fastener 46 is a torque-limiting fastener which may be secured within the system, and provides for slippage once fully secured in a system, thereby preventing overtightening.

From head 94, fastener 46 forms an elongated shank 96 terminating in a threaded tip 98. Spring 58 is dimensioned to fit loosely around shank 96, and contacts an annular abutment 100 integral with shank 96 when installed. Apertures 102 are provided through fans 48 which span the width of heat sink 22, permitting the passage of shank 96 and threaded tip 98 therethrough. Moreover, as illustrated in FIG. 7, aperture 54 provided in upper fin 52 is dimensioned so as to permit passage of spring 58 and annular abutment 100 therethrough.

As mentioned above, heat sink 22 includes features permitting its mounting on housing 18, and for securing ejectors 42 in place. In particular, a pair of apertures 104 are provided in upper corners of rear panel 72 for receiving rivets 44 used to pivotally mount ejectors 42. Moreover, as mentioned above, apertures 74 are provided in locations in rear panel 72 of the heat sink for receiving fasteners 76 used to secure the heat sink to the component housing. In the illustrated embodiment, component housing 18 features a metallic rear plate 106 for transmitting heat from the component mounted in the housing. Rear plate 106 has a series of threaded apertures 108 formed therein, which align with apertures 74 and threadingly receive fasteners 76 to secure the components of the package in place.

The preferred configuration of retainer 60 also facilitates assembly of the component package. In the embodiment illustrated in FIG. 7, retainer 60 is made of a molded, resilient plastic material. A pair of biasing projections 110 are formed integrally with the body of retainer 60, extending from a rear surface thereof. Moreover, a compound aperture 112 is formed in an upper plate 114 of the retainer for permitting passage of shank 96, threaded tip 98, and annular abutment 100 of fastener 46, as well as of spring 58 during assembly of the package. Compound aperture 112 also serves to retain these components in the assembled package. Accordingly, compound aperture 112 includes a reduced dimension portion 116 having a radius generally corresponding to that of shank 96. A greater dimension portion 118 is contiguous with portion 116, and is dimensioned to permit passage of abutment 100 and spring 58. A front panel 120 of retainer 60 provides a surface against which a force may be applied to overcome the force of biasing projections 110 for assembly of the fastener and biasing spring as described more fully below.

Figures 8, 9, 10:
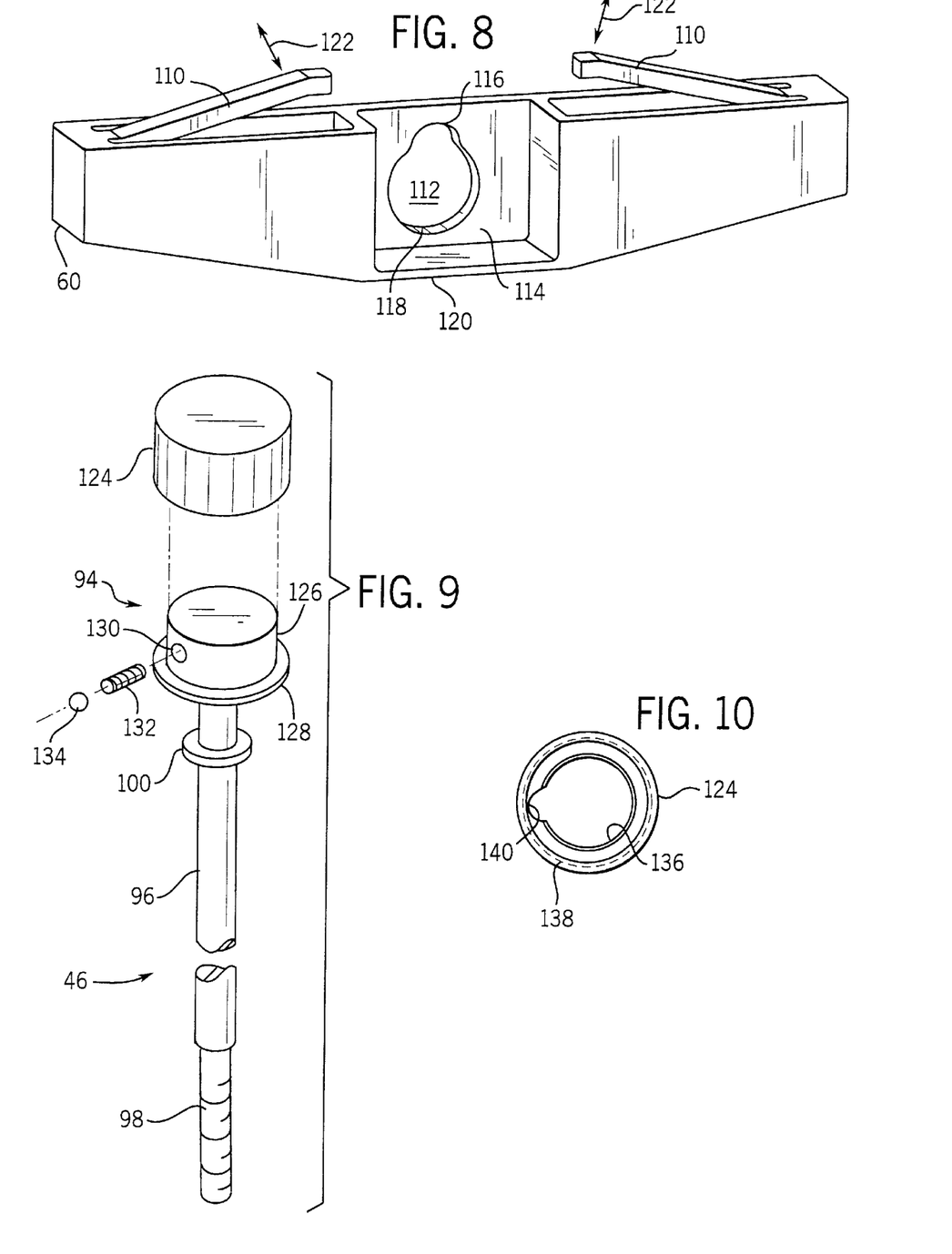
FIG. 8 is a perspective view of a retaining element for resiliently holding a fastener in the securement system.
FIG. 9 is an exploded view of a torque-limiting fastener for use in one embodiment of the securement system.
FIG. 10 is a bottom plan view of a head or cap of the fastener of FIG. 9 configured to limit torque on the fastener during securement of the package.

The preferred configuration of retainer 60 is illustrated in greater detail in FIG. 8. As shown in FIG. 8, biasing projections 110 extend rearwardly from the body of the retainer. Again, upper plate 114 (shown from a bottom perspective view in FIG. 8) includes a compound aperture 112 having a region of reduced dimension 116 and a region of greater dimension 118. In the illustrated embodiment, biasing projections 110 are elastically deformable as indicated by arrows 122 in FIG. 8 to urge retainer 60 to an outward position in which reduced dimension portion 116 of aperture 112 engages shank 96 above abutment 100 as described below. However, the biasing projections are easily deformable to facilitate assembly.

As mentioned above, in a presently preferred embodiment, fastener 46 includes features permitting it to limit torque applied to mechanical supports 32 during securement of the component package. FIGS. 9 and 10 illustrate a presently preferred configuration for a torque-limiting fastener of this type. As shown in FIG. 9, fastener 46 may be configured as an assembly including a cap 124 forming part of the head 94 of the fastener. An inner housing 126 fits within cap 124 and is bounded at its lower extremity by an annular protrusion or ring 128. A radial bore 130 is formed in inner housing 126 and is dimensioned to receive a compression spring 132. A ball or a similar bearing component 134 also fits within bore 130 and is urged radially outwardly by spring 132 in operation.

As illustrated in FIG. 10, inner surfaces cap 124 are formed to retain the cap on housing 126, and to limit torque of the fastener in use. Accordingly, an inner peripheral surface 136 of cap 124 receives housing 126 and maintains the housing centered within the cap. An inner groove 138, which fits below ring 128 when assembled, is designed to receive a snap ring or similar retaining device (not shown) for holding cap 124 in engagement over housing 126. Inner peripheral surface 136 also forms a cam surface 140 which engages ball 134 when cap 124 is placed over housing 126. In operation, the user may turn cap 126 to rotate to fastener 46 and thereby threadingly engage the fastener into a threaded bore 62 of a mechanical support 32 as described above. However, when a maximum allowable torque is reached, compression spring 132 is compressed within bore 130, permitting ball 134 to ride over cam surface 140, causing cap 124 to spin on housing 126. Owing to the configuration of cam surface 140, the fastener may be easily removed in a reverse direction by engagement of ball 134 with the cam surface. The ability to limit torque on the fastener in the securement system permits the user to have tactile and auditory feedback of full engagement of the component package in its socket and support, while providing a straightforward securement structure which does not require special tooling for assembly.

Figure 11:
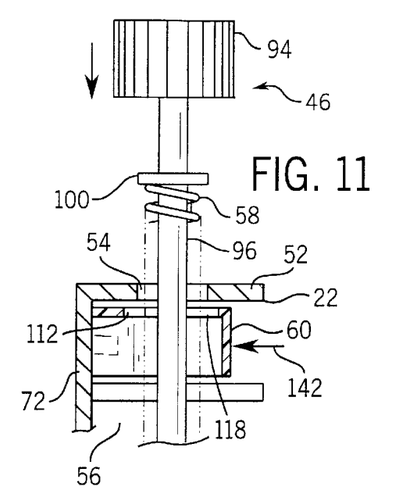
FIG. 11 is a partial sectional view through a portion of the package of FIG. 1 illustrating the cooperation of the retaining element and associated components for facilitating insertion of the fastener and biasing assembly.
Figure 12:
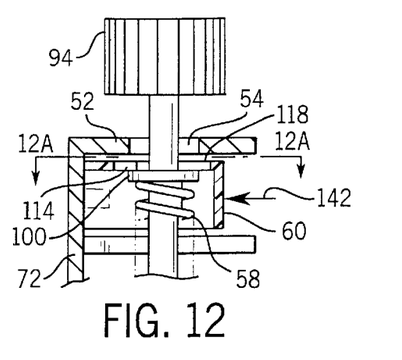
FIGS. 12 and 12A are side elevation and top sectional views, respectively, of the assemblies shown in FIG. 11 following full insertion of the fastener and biasing assembly into the securement package.
Figure 13:
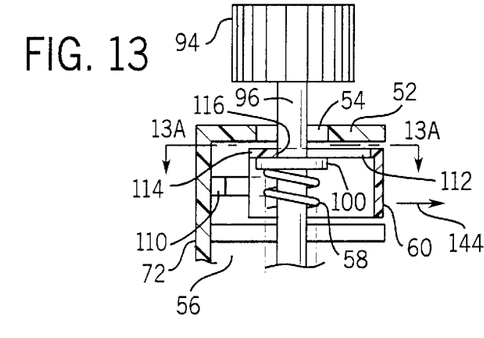
FIGS. 13, 13A, and 13B are side and top sectional views of the assembly of FIG. 11 following release of the retaining element and movement of the fastener for securement of the package in its support.

FIGS. 11–13 illustrate sequential steps in assembly of fastener 46 and spring 58 within heat sink 22 and retainer 60. As shown first in FIG. 11, with retainer 60 in lace below upper fin 52 of the heat sink, fastener 46 is passed through aperture 54 in upper fin 52, with spring 58 disposed about shank 96, and in contact with abutment 100. To permit passage of the spring and abutment therethrough, retainer 60 is depressed against rear panel 72 of the heat sink as indicated by arrow 142 in FIG. 11, thereby aligning greater dimension portion 118 of aperture 112 with aperture 54.

Figure 12A:
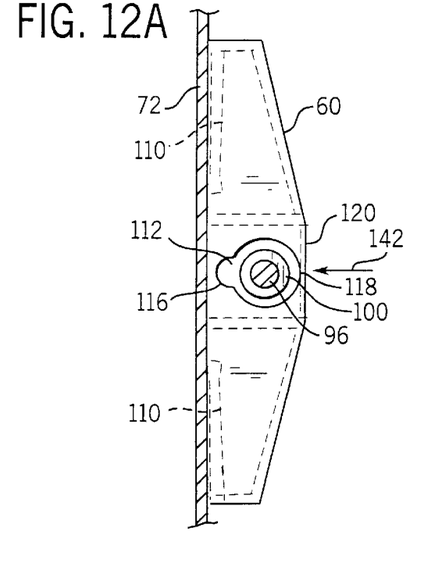

FIG. 12 illustrates the same components following full insertion of fastener 46 and spring 58 through aperture 54 and retainer 60. At this stage in the assembly, spring 58 is located below upper plate 114 of the retainer, as is annular abutment 100. As shown in FIG. 12A, force applied as indicated by arrow 142 causes a deformation of biasing projections 110 against rear panel 72 of the heat sink. The alignment of the apertures, including the greater dimension portion 118 of aperture 112, facilitates passage of the spring and abutment therethrough.

Figure 13A:
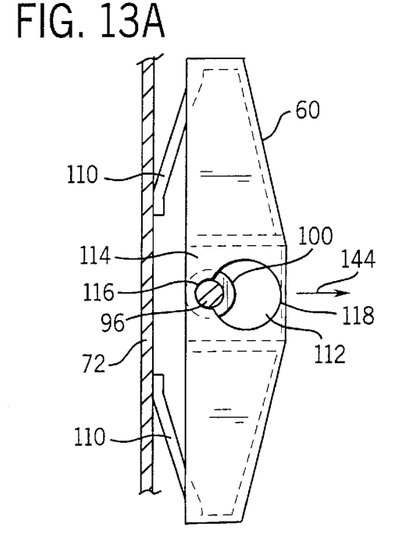
Figure 13B:
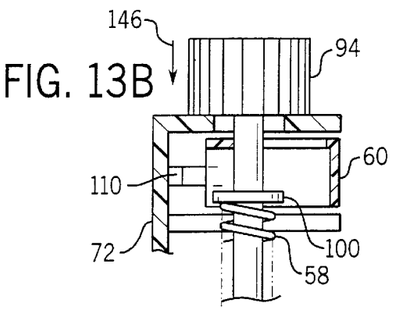

FIG. 13 illustrates the same components following release of the retainer. As shown in FIG. 13, as force is removed from the front surface of retainer 60, as indicated by arrow 144, biasing projections 110 urge retainer 60 outwardly (i.e., to the right in FIG. 13, away from rear panel 72), thereby shifting reduced dimension portion 116 of aperture 112 into engagement about shank 96 of the fastener. Spring 58 urges the fastener upwards by engagement with abutment 100. However, upward movement of the fastener is limited by engagement of abutment 100 against upper plate 114 of the retainer. As illustrated in FIG. 13A, biasing projections 110 maintain the retainer in an outward position wherein shank 96 remains captured within reduced dimension portion 116 of aperture 112, and abutment 100 remains captured below plate 114. As shown in FIG. 13B, as fastener 46 is then engaged to draw the component package into full engagement within the electrical socket and mechanical support, head 94 of the fastener is free to contact upper fin 52 to draw the package downwardly, causing a downward motion of abutment 100 and compression of spring 58. Retainer 60 remains urged outwardly about shank 96.

It has been found that the foregoing biasing and retaining structure significantly facilitates assembly and disassembly of the component package. In particular, as illustrated in FIGS. 5 and 7, the securement portions of the component package, including heat sink 22, fastener 46, spring 58, retainer 60, and ejectors 42 may be premanufactured as a subassembly for subsequent mounting on a processor assembly 16 or similar package. Removal of fastener 46, such as for insertion of a fastener 76 in a center position of the heat sink (see, e.g., FIG. 7), is facilitated by simply depressing retainer 60 and partially removing fastener 46 by following the inverse procedure described above with respect to FIGS. 11–13. Thereafter, the fastener can be easily reinserted in its receiving apertures, and the retainer released to hold the fastener and biasing spring securely in place.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An assembly for securing an electronic component to a mating support, the support including a socket configured to receive a portion of the component, the assembly comprising:
    a base adjacent to the socket, the base including an aperture for receiving a fastener;
    a heat sink having a substantially planar securement surface configured to be secured to the component for dissipating heat generated during operation of the component; and
    a fastener having a head disposed at a distal end with respect to the socket, the fastener extending through a portion of the heat sink in a direction generally parallel to the plane of the securement surface, the fastener being receivable in the aperture for securing the component in engagement with the socket.

2. The assembly of claim 1, further including a biasing member coupled between the fastener and the heat sink, the biasing member urging the fastener toward a disengaged position away from the base.

3. The assembly of claim 1, further including a biased retaining member, the retaining member including an aperture configured to permit passage of the fastener therethrough for assembly, and preventing release of the fastener following assembly.

4. The assembly of claim 3, wherein the retaining member includes at least one biasing element urging the retaining member to a retaining position wherein the retaining member prevents removal of the fastener.

5. The assembly of claim 4, wherein the at least one biasing element is integral with the retaining member and is deformable to allow movement of the retaining member to an assembly position wherein the fastener may be removed therefrom.

6. The assembly of claim 3, further comprising a biasing member coupled between the fastener and the heat sink, the biasing member urging the fastener away from the base, and wherein the retaining member retains the biasing member following assembly.

7. The assembly of claim 1, wherein the heat sink includes a plurality of heat dissipating fins, and wherein the fastener extends through and is retained by at least one of the fins.

8. The assembly of claim 1, wherein the heat sink includes a reference surface which contacts the base upon full engagement of the component in the socket.

9. The assembly of claim 1, wherein the base includes a mechanical support member disposed on a circuit board generally parallel to the socket.

10. The assembly of claim 1, wherein the fastener includes a threaded region which engages a mating threaded aperture of the base to secure the component in the socket, and wherein the fastener includes a torque limiting assembly for limiting tightening of the fastener in the base.

11. An electronic component module for assembly with a component interface including a plurality of conductors, the component module comprising:
    an electronic component package extending substantially in a plane and including an electronic component configured to be connected to external circuitry via the component interface; and
    a securement assembly extending from the component package, the securement assembly including a support and a fastener having a threaded end retained by the support and extending substantially parallel to the plane, the fastener threaded end being configured to be received in the component interface adjacent to the plurality of conductors to draw the component into an installed position in the component interface and thereby to complete electrical connections between the component module and the plurality of conductors.

12. The component module of claim 11, wherein the support includes a heat sink secured to the component package for dissipating thermal energy generated during operation of the component.

13. The component module of claim 12, wherein the heat sink includes a plurality of fins extending substantially transverse to the plane, and wherein the fastener is supported by at least one fin of the heat sink.

14. The component module of claim 11, wherein the support includes a reference surface for limiting engagement of the component in the component interface.

15. The component module of claim 11, wherein the fastener includes a threaded portion for engaging the component interface, and wherein the fastener includes a torque limiting assembly for limiting torque on the fastener following full engagement of the module in the component interface.

16. The component module of claim 11, wherein the electronic component includes an edge configured to be received in an interface socket housing the plurality of conductors, and wherein the fastener contacts a portion of the support to draw the edge into engagement in the socket upon installation of the module, thereby completing the electrical connections.

17. A computer system comprising:
 a supporting board, the supporting board including an electrical socket and a mechanical support adjacent to the socket;
 an electronic component having an edge engageable in the socket for completing connection of the component to the supporting board; and
 a securement assembly coupled to the component, the securement assembly including a heat dissipating member and a fastener coupled to the heat dissipating member, the fastener having a head at an end thereof distal from the engageable edge of the component, the fastener being engageable in the mechanical support to advance and retain the edge of the component in the socket.

18. The computer system of claim 17, wherein the electronic component extends substantially in a plane transverse to the support board, and wherein the heat dissipating member includes a plurality of fins and, the fastener extending through at least one of the fins.

19. The computer system of claim 17, wherein the heat dissipating member includes a reference surface which contacts the mechanical support to limit movement of the component into the socket.

20. The computer system of claim 17, wherein the securement assembly is removable from the component.

21. The computer system of claim 17, wherein the fastener includes a torque limiting assembly for limiting engagement torque of the fastener in the mechanical support.

22. The computer system of claim 17, wherein the securement assembly includes a biasing member urging the fastener towards a disengaged position.

23. An assembly for securing an electronic component to a mating support, the support including a socket configured to receive a portion of the component, the assembly comprising:

a base adjacent to the socket, the base including an aperture for receiving a fastener;
 a heat sink having a substantially planar securement surface configured to be secured to the component for dissipating heat generated during operation of the component;
 a fastener extending through a portion of the heat sink in a direction generally parallel to the plane of the securement surface, the fastener being receivable in the aperture for securing the component in engagement with the socket; and
 a biased retaining member, the retaining member including an aperture configured to permit passage of the fastener therethrough for assembly, and preventing release of the fastener following assembly.

24. The assembly of claim 23, wherein the retaining member includes at least one biasing element urging the retaining member to a retaining position wherein the retaining member prevents removal of the fastener.

25. The assembly of claim 24, wherein the at least one biasing element is integral with the retaining member and is deformable to allow movement of the retaining member to an assembly position wherein the fastener may be removed therefrom.

26. The assembly of claim 23, further comprising a biasing member coupled between the fastener and the heat sink, the biasing member urging the fastener away from the base, and wherein the retaining member retains the biasing member following assembly.

27. The assembly of claim 23, wherein the heat sink includes a plurality of heat dissipating fins, and wherein the fastener extends through and is retained by at least one of the fins.

28. The assembly of claim 23, wherein the heat sink includes a reference surface which contacts the base upon full engagement of the component and the socket.

29. The assembly of claim 23, wherein the base includes a mechanical support member disposed on a circuit board generally parallel to the socket.

30. The assembly of claim 23, wherein the fastener includes a threaded region which engages a mating threaded aperture of the base to secure the component in the socket, and wherein the fastener includes a torque limiting assembly for limiting tightening of the fastener in the base.

\* \* \* \* \*